United States Patent
Feinstein

Patent Number: 5,265,099
Date of Patent: Nov. 23, 1993

[54] METHOD FOR HEATING DYNAMIC MEMORY UNITS WHEREBY

[76] Inventor: David Y. Feinstein, 5231 Caversham, Houston, Tex. 77096

[21] Appl. No.: 661,604

[22] Filed: Feb. 28, 1991

[51] Int. Cl.$^5$ ............................................. G11C 29/00
[52] U.S. Cl. .................................. 371/21.1; 371/21.4; 371/27; 371/28; 324/158 R; 324/73.1
[58] Field of Search ...................... 371/21.1, 5.1, 21.4, 371/27, 28, ; 324/158 R, 73.1; 365/201

[56] References Cited

U.S. PATENT DOCUMENTS

| | | | |
|---|---|---|---|
| 3,867,618 | 2/1975 | Oliver et al. | 371/28 |
| 4,016,408 | 4/1977 | Koetzle | 371/28 |
| 4,504,929 | 3/1985 | Takemae et al. | 371/21.4 |
| 4,553,225 | 11/1985 | Ohe | 371/21.4 |
| 4,779,041 | 10/1988 | Williamson, Jr. | 324/158 R |
| 4,779,043 | 10/1988 | William, Jr. | 324/158 R |
| 4,799,021 | 1/1989 | Cozzi | 324/158 R |
| 4,809,231 | 2/1989 | Shannon et al. | 371/21.4 |
| 4,818,934 | 4/1989 | Tamamura | 324/158 R |
| 4,827,208 | 5/1989 | Oliver et al. | 371/28 |
| 4,835,458 | 5/1989 | Kim | 324/158 R |
| 4,841,233 | 6/1989 | Yoshida | 371/21.4 |

OTHER PUBLICATIONS

"Fundamentals of Testability-A Tutorial" by Fritzmeier et al., IEEE Transactions on Industrial Electronics, vol. 36, No. 2, May 1989, pp. 117-128.

*Primary Examiner*—Robert W. Beausoliel, Jr.
*Assistant Examiner*—Phung My Chung

[57] ABSTRACT

Dynamic memory heating method in which the control lines of the memory unit are excited with pulses at a rate above the maximum rate used for regular memory functions. While data retention, storage and access capabilities disappear at such rates, the memory unit main current supply exhibits higher rate of current spikes which are used for heating the memory unit. This heating effect tends to increase while increasing the rate at the control lines until a maximum point is reached. Further increase of the rate results with reduced overall current consumption which leads to a reduced heating. An automatic system for detecting this maximum rate of pulses controls the maximum heating of the dynamic memory unit.

19 Claims, 2 Drawing Sheets

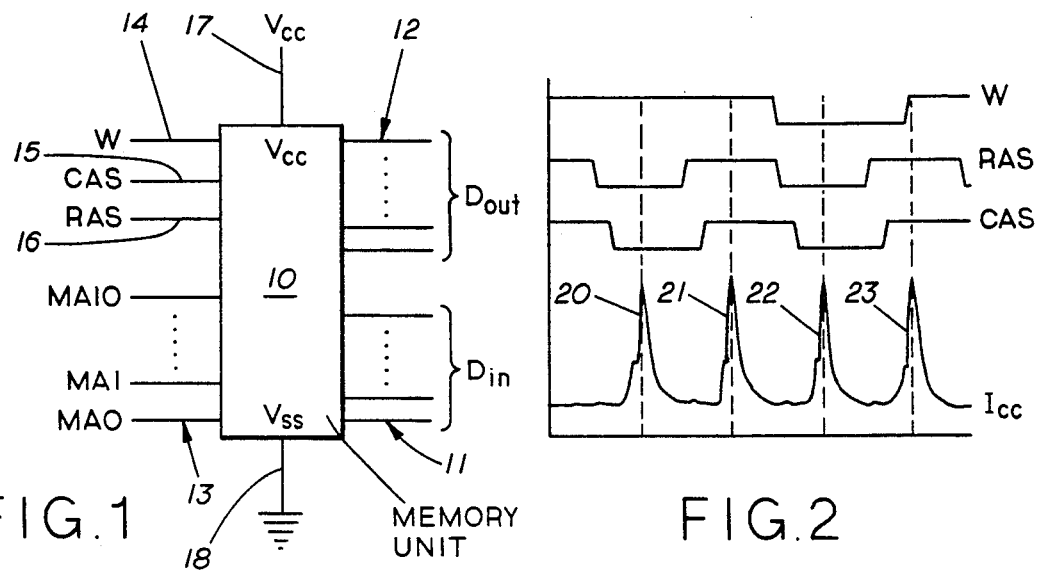
FIG.1
FIG.2
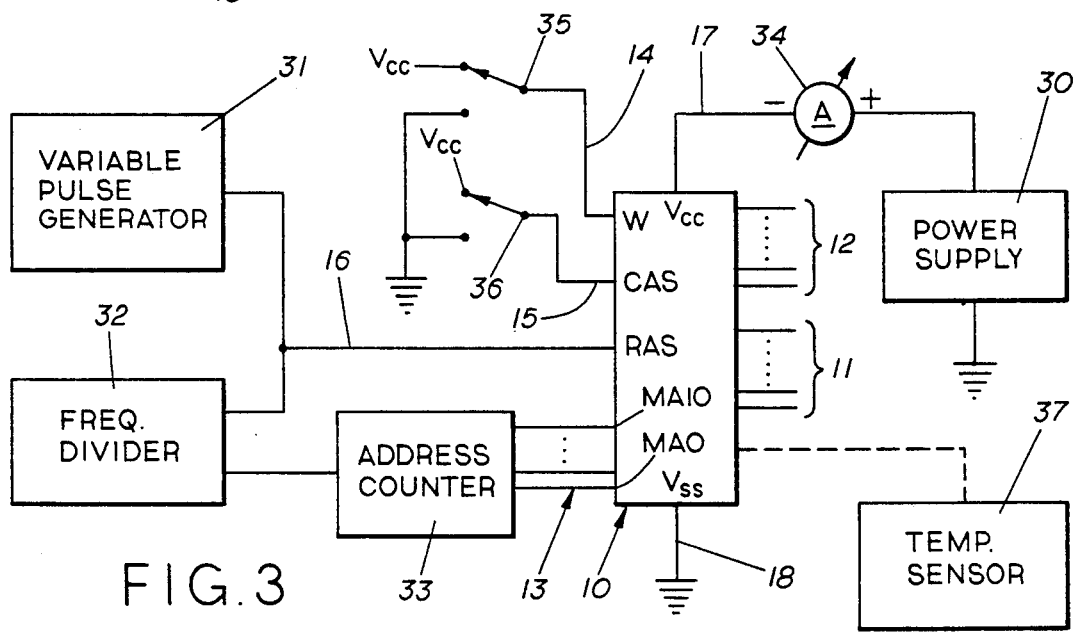
FIG.3
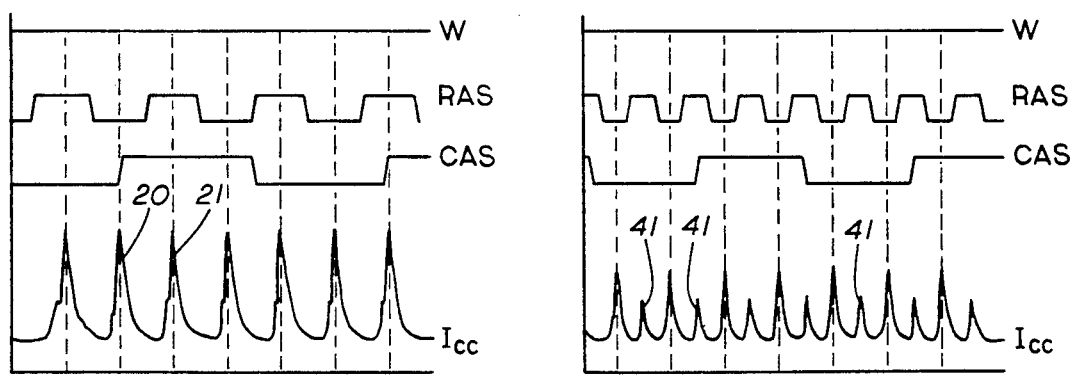
FIG.4
FIG.5

METHOD FOR HEATING DYNAMIC MEMORY UNITS WHEREBY

BACKGROUND OF THE INVENTION

1. Field of the Invention

This invention generally relates to the field of testing electronic circuits under operational temperatures. More particularly, the present invention relates to a method for controlled heating of electronic dynamic memory units.

2. Description of the Prior Art

Dynamic memory units exhibit degrading operation at a higher working temperature as the data retention capability and the access time are reduced. This reduction in data retention capability is due to the exponential increase in the memory cell's leakage current when the ambient temperature is increased. Such a reduction in the data retention capability of the dynamic memory cells necessitates a more frequent refresh activity. The access time, or the operational speed of the dynamic memory unit, decreases when the ambient temperature is increased due to the physical properties of the MOS/-CMOS material and processes used to produce the memory units.

Therefore, it is well known in the art that memory units must be tested while subjected to their highest operating temperature. Although memory units do warm up during normal operation of their internal circuitry, they do not reach a sufficiently high temperature.

The most common method for such heating uses a controlled temperature oven. The memory unit is placed inside a special oven which is kept at the desired high temperature. The disadvantage of this method is that such an oven is fairly expensive and cumbersome which render it unsuitable for low cost, portable memory tester. Another major disadvantage of such heating is that when the memory unit is kept in the oven, it must be physically connected to the tester via a relatively long cable. This cable introduces distortions and propagation delays on the data signals. Yet a further disadvantage is that the memory module is heated from the outside so that it takes a certain period of time for the internal portion of the memory to reach the desired temperature.

Another method known to the art is to generate heat inside the memory unit by use of induction (e.g. controlled microwave radiation). While this method is faster than the oven method, all the remaining disadvantages as described above are also relevant with induction heating. Another further disadvantage typical of the induction heating method is that it may damage the memory unit when variations in the internal density of metallic/non-metallic components causes wrong distribution of the internal heat.

SUMMARY OF THE INVENTION

The present invention overcomes the disadvantages of the prior art by heating a dynamic memory unit through selectively applying a relatively high frequency signals at the main control lines of the memory unit. While the memory units cease to retain data during this heating process, the internal circuitry continue to recharge the memory cells at a higher rate than in normal memory function, therefore they produce much more heat which brings the memory unit to its highest operating temperature. The memory unit cannot be damaged since all signals and supply voltages are kept within their maximum rating.

It is, therefore, the primary object of the present invention to provide a low cost, easy to handle and efficient method for heating dynamic memory units.

It is also the object of the present invention to provide a method of heating the memory units while they are mounted directly on the tester without the need for extra cable connections that may introduce timing delays and distortions.

It is another object of the present invention to provide a method for heating memory units without the danger of damaging the memory units.

It is yet another object of the present invention to provide a quick method for heating memory units internally.

It is further object of the present invention to provide a dynamic memory heating method by which an existing memory tester can be easily modified to test the memory at high working temperature.

These and other objects, advantages and features shall hereinafter appear, and for the purpose of illustrations, but not for limitation, exemplary embodiments of the present invention are described in the following detailed description and illustrated in the accompanying drawings in which like reference numerals designate corresponding elements.

BRIEF DESCRIPTION OF THE DRAWINGS

FIG. 1 is a block diagram of a dynamic memory unit illustrating its various control, address and data lines.

FIG. 2 is a waveform diagram showing the current consumption of a typical dynamic memory unit in relation to its control signals when working under normal operation conditions.

FIG. 3 is a schematic diagram of a manually controlled system for heating electronic memory in accordance with the present invention.

FIG. 4 is a waveform diagram showing the current consumption of the dynamic memory unit when it is heated by the system of FIG. 3.

FIG. 5 is another waveform diagram showing a reduced average current which results when the memory unit is heated by a RAS pulse rate which exceeds the optimal setting.

DETAILED DESCRIPTION OF THE PREFERRED EMBODIMENT

Figure 6:
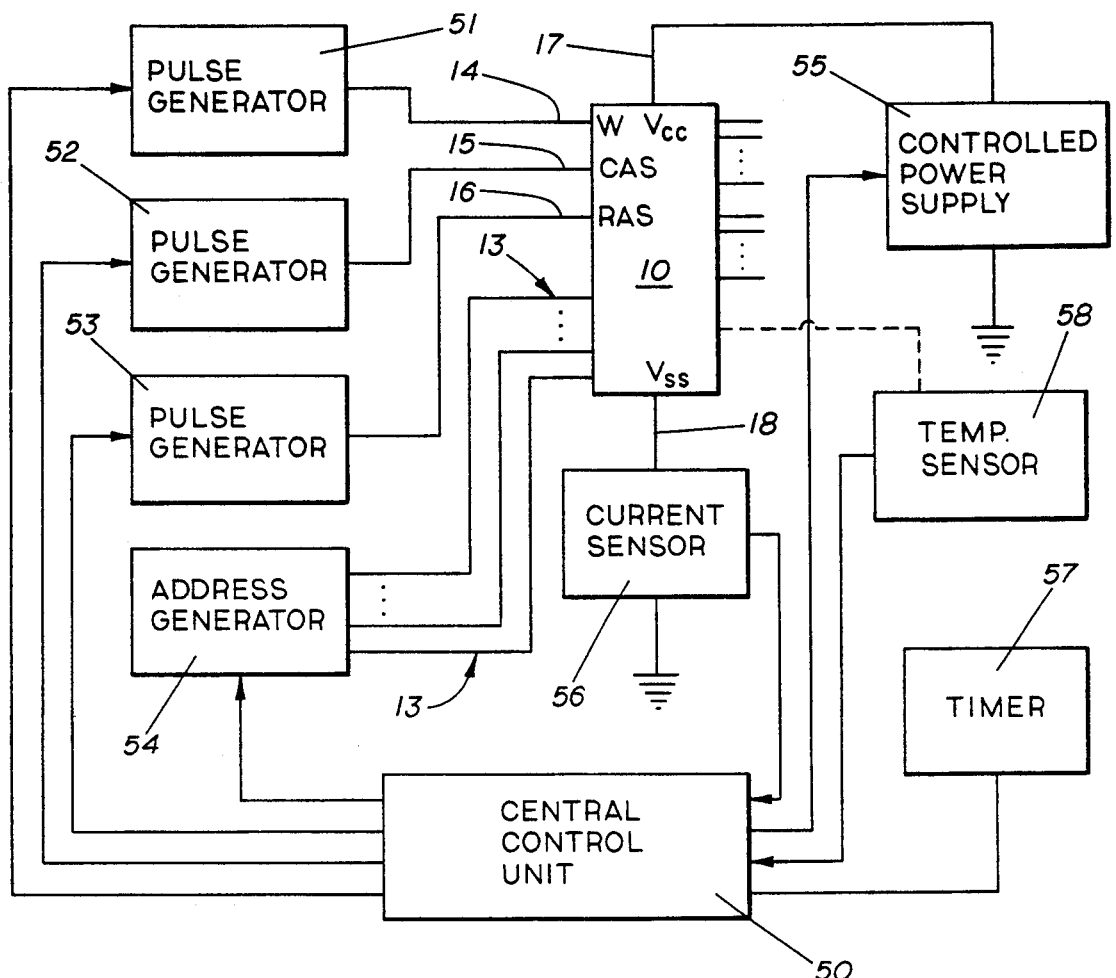
FIG. 6 is a schematic diagram of an automatically controlled system for heating electronic memory in accordance with the present invention.

Referring initially to FIG. 1 there is shown a block diagram of a typical dynamic memory unit 10. The dynamic memory unit may be implemented on a single integrated circuit, called a memory chip, or it may be composed from a plurality of such memory chips which are mounted on a printed circuit board to form a memory module. In typical memory modules, the control lines and address lines are all connected in parallel. Other variations include dynamic memory with two or more Input/Output ports and larger memory boards which comprise memory units and/or memory modules with support circuitry for data buffering, control and addressing. While such dynamic memories are commercially available with a variety of capacities and data sizes, their principle of operation is similar. The memory unit has a set of connections 11 for inputting the data to be stored in the memory and a set of connections 12 for outputting the stored data. In some cases, the corresponding output and input of the same bit location are connected together in what is known as common I/O. To reduce the overall pin-count, the entire address is divided into a row and a column portions which are multiplexed on a set of address lines 13, which, for a typical 4 Megabit dynamic memory chip, are enumerated MA0-MA10. The memory cells of a typical memory unit are arranged in arrays comprising rows and columns. The strobing of the address data and the general cycle of operation of the memory unit are controlled by control line 16 RAS (ROW ADDRESS STROBE) and control line 15 CAS (COLUMN ADDRESS STROBE). The function of read cycle or write cycle is determined by the W control line 14. Various type of memory units may have different arrangements of control lines or they may have multiple control lines of the same type like RAS0, RAS1, RAS2 and RAS3. Any reference in this disclosure to a single control line should be applied to any existing multiple control lines of the same type. The memory is connected to a DC power supply which is typically supplying 5 Volts. The positive power supply connection 17 is marked Vcc and the ground connection 18 Vss is marked Vss.

FIG. 2 is a waveform diagram showing the current consumption Icc of the memory unit when the memory is working under normal conditions in which data is stored or read from the memory and the memory is internally refreshed. The address and data lines are not shown in this figure for clarity. The RAS, CAS and W diagrams show the voltage levels on these lines while the Icc diagram shows the corresponding current that the memory unit consumes from the power supply. It is very clear from the Icc diagram that the current consumption of the memory unit cannot be approximated by a linear resistor. In fact, the Icc diagram indicates that the current is fairly low during most of the RAS/CAS cycle with strong current peaks 20-23 occurring at certain times. These spikes are the result of the charging effect of the capacitor based memory cells whenever a refresh, read or write operation is performed. While the exact time in relation to the control signals, when these current peaks occur, is different from one memory unit to another, all dynamic memory units are characterized by the pronounce existence of such current peaks. Some memory units may exhibit larger spikes 23 during write operation than the spike 20 during the read operation.

The proper memory functions, storing, retention and reading of data, can be achieved only within a certain rate of the RAS control signal. When this rate is exceeded, memory functions become corrupted due to propagation delays and other internal timing requirements of the memory unit. Therefore, textbook design principles require that the RAS control line should not exceed this maximum useful rate. However, our experimentation with various waveforms at higher frequencies than the maximum useful memory frequency applied at the memory unit's control signals illustrated that more spikes of consumption current can be generated inside the memory unit even when the memory unit cease to function as a proper memory unit. Our experiments showed that these higher rate of current spikes can be successfully used to heat the memory unit internally. Further, numerous experiments with different memory units established that the memory units are not damaged when subjected to such higher rate signals in their control lines, provided that all voltage levels on all the power connections and on any other connection do not exceed maximum rating.

A manually controlled embodiment of the present invention is shown in FIG. 3. The memory unit 10 is connected to the power supply 30 through the Vcc line 17 and the Vss line 18. A variable pulse generator 31 is connected to the RAS control line 16. The CAS control line 15 and W control line 14 are kept at either logic 1 or logic 0 by means of switches 35 and 36. Alternatively, the CAS and W control lines may be connected to additional variable pulse generators in a similar way to the RAS line. It should be pointed here that while the increase in overall current consumption in the memory unit seems to be primarily related to the RAS line, it is also dependent on the CAS and W control lines and must be determined experimentally. A DC current meter 34 indicates the average current through the memory unit 10. In addition to this meter, the user may use a temperature sensor 37 adaptable to measure the temperature of the memory unit. The user can change the pulse rate and duty cycle of the variable pulse generator 31 in order to get the highest current reading from the meter 34. A frequency divider 32 is used to divide the rate of the pulse generator 31 and to provide lower rate pulses to an address counter 33 which controls the address lines 13 of the memory unit. The address counter 33 continuously changes the row address which is being charged by the partial operation of the memory unit at the abnormally high RAS rate. Since different rows of cells are being charged when the address is changed, higher current spikes can by achieved as the memory cells of each row have more time to discharge. Further, changing the address activates different topological locations in the memory unit which is very important for achieving a relatively even heat distribution. Alternatively, reduced heating may be still achieved when the address lines are kept tied to ground level or to a logical 1 level.

FIG. 4 is a waveform diagram showing the effect of increasing the rate of the RAS signal on the memory current consumption Icc. Comparing FIG. 4 to FIG. 2 shows that the rate of current spikes increases significantly as we double the rate of the pulses at RAS. The result is an increase in the power consumption of the memory unit which translates to useful heating of the memory unit. However, as we increase the RAS rate we reach a point where additional increase of the rate is becoming too fast to charge the memory cells. Evidently, this rate produces the maximum heating of the memory unit. FIG. 5 shows what happens when the rate is increased beyond this point. Some peaks 41 are becoming smaller and the overall current consumption transformed to heat is smaller. If the RAS rate is further increased there is a subsequent decrease in the total current flowing through the memory unit. This fact explains in part why the memory unit is protected from damage when the RAS rate is increased without limit.

A fully automatic embodiment of the present invention is illustrated in the schematic diagram of FIG. 6. A set of three pulse generators 51, 52 and 53 are connected to the control lines 14, 15, and 16 of the memory unit 10. All the pulse generators are individually controlled by a central control unit 50 so that they are capable to generate pulses of varying rates and duty cycles as well as to keep their output at a fixed logical 0 or 1. The memory unit's address lines 13 are connected to an address generator 54 which is also controlled by the central control unit 50. The memory unit 10 receives its power from a controlled power supply 55 which can generate DC levels within the normal operating voltages of the memory unit under control of the central processor unit 50. With typical dynamic memory units, this voltage range should be preferably from 4.5 V to 6.5 V. The current flowing from the ground connection 18 of the memory unit passes through a current sensor 56 which provides current information to the central control unit. An optional timer 57 unit provides the central processor unit 50 with an elapsed time signal which may be used for timing various stages in the heating process. An optional temperature sensor 58 which is adapted to measure the temperature of the memory unit is further connected to the central control unit 50.

The central control unit 50 of FIG. 6 can be readily implemented with commercially available micro computers which typically include a processor, parallel interface for controlling the above mentioned elements and an A/D converter for converting the measured current and temperature information to digital representation. Such a micro computer often has a built in timer. The program of the microprocessor changes the setting of the pulse generators 51-53 in order to maximize the reading from the current sensor 56. Further control of the heating is made by increasing the voltage of the controlled power supply 55. Alternatively, the program may heat the memory unit at several stages, first starting a lower average current reading and then switching to the maximum current that will yield the highest heating of the memory unit. The optional temperature sensor 58 serves as a secondary control loop for the central control unit 50 in monitoring and controlling the heating of the memory unit.

Figure 7:
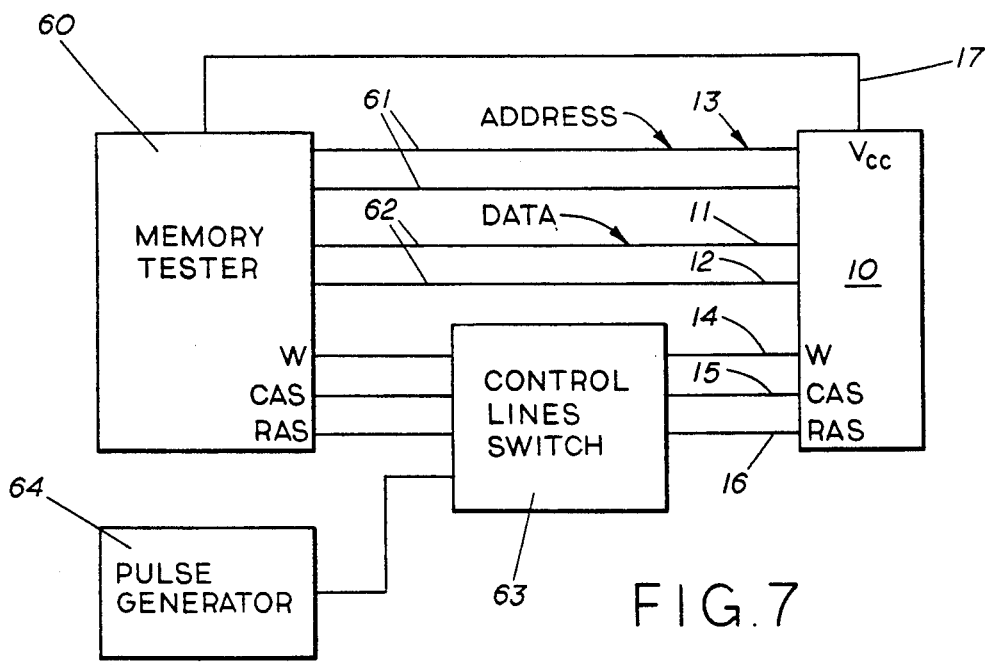
FIG. 7 is a schematic diagram illustrating the integration of the present invention in a typical memory tester circuitry.

One of the main advantages of the present invention is its immediate and simple implementation in a typical memory tester. FIG. 7 illustrates such an implementation where the tested memory unit is periodically subjected to a heating cycle. The memory tester 60 is connected to the memory unit 10 through the address lines 61 and the data lines 62. During the actual memory testing, the memory unit control lines RAS 16, CAS 15 and W 14 are controlled by the memory tester 60 through a control lines switch 63. During the heating cycle, the control lines switch 63 is activated to connect a pulse generator 64 to the memory unit's control lines. Such switching may involve only the RAS signal and/or the CAS and/or W lines. During the application of the pulses from the pulse generator 64, the memory tester 60 continues to provide the signals for the address lines, thus achieving better distribution of the heating process throughout the internal memory cell array of the memory unit. When the high rate pulses are applied only to the RAS control line, the remaining control lines, CAS and W may be also activated by the memory tester 60.

In many cases, the memory tester 60 is based on a general purpose computer which test the memory unit in various steps, in each step a different testing algorithm and procedure is used. The above heating scheme may be incorporated in a separate heating step, after which the memory unit is tested at a high temperature. Alternatively, short periods of heating may be time multiplexed between subsequent short tests.

While there is shown and described herein certain specific systems embodying the invention, it will be manifest to those skilled in the art that various modifications and rearrangements of the parts may be made without departing from the spirit and scope of the underlying inventive concept and the same is not limited to the particular forms herein shown and described except insofar as indicated by the scope of the appended claims.

What is claimed is:

1. A method of raising the temperature of a dynamic memory unit having a row address strobe control line, which comprises:
   supplying electrical power to the memory unit at an operational voltage level;
   applying pulses having variable rate and variable duty cycle at said row address strobe control line of said memory unit;
   measuring the current flowing through said memory unit; and
   adjusting said variable rate and said variable duty cycle of said pulses above the maximum rate at which said memory unit performs useful memory functions so that the measurement of the current flowing through said memory unit reaches a maximum reading corresponding to a maximum internal power dissipation in said memory unit.

2. The method of claim 1 wherein said memory unit having a column address strobe control line, and wherein further applying pulses having variable rate and variable duty cycle at said column address strobe control line of said memory unit, and wherein said variable rate and said variable duty cycle of said pulses at the column address strobe control line are being adjusted for a maximum current flow through said memory unit.

3. The method of claim 1 wherein said memory unit having a write control line, and wherein further applying pulses having variable rate and variable duty cycle at said write control line of said memory unit, and wherein said variable rate and said variable duty cycle of said pulses at the write control line are being adjusted for a maximum current flow through said memory unit.

4. The method of claim 1 wherein said memory unit having a plurality of address lines, and wherein said address lines of said memory unit are electrically connected to a means for generating varying address signals so that different memory rows are being charged in accordance with the different addresses applied to said memory unit.

5. The method of claim 4 wherein said means for generating varying address signals cycle sequentially through all row addresses of said memory unit.

6. The method of claim 1 wherein further measuring the surface temperature of said memory unit, and wherein said variable rate and said variable duty cycle of said pulses are being adjusted to that said measured temperature of said memory unit is kept at a predetermined level.

7. A system for raising the temperature of a dynamic memory unit having a row address strobe control line, comprising:
   a power supply electrically connected to said memory unit adapted to supply electrical current at an operational voltage level below the maximum voltage rating of said memory unit;
   means for generating pulses having variable rate and variable duty cycle connected to said row address strobe control line of said memory unit, said pulse generating means having a control input means for adjusting said variable rate and said variable duty cycle of said pulses;

means for measuring the current supplied by said power supply to said memory unit and for outputting data corresponding to the average of said current; and response means for accepting said output data and responsive thereto for outputting a control signal connected to said control input means of said pulse generating means so that the rate of said pulses is adjusted to a rate above the maximum operational rate of said memory unit which corresponds with maximum average current data.

8. A system as recited in claim 7 wherein said memory unit having a column address strobe control line, further comprising means for generating column address strobe pulses having variable rate and variable duty cycle connected to said column address strobe control line, said column address strobe pulses generating means having a control input means for adjusting the variable rate and variable duty cycle of said column address strobe pulses, said response means is further responsive to said output data for outputting a control signal connected to said control input of said column address strobe pulses generating means so that maximum average current flows through said memory unit.

9. A system as recited in claim 7 wherein said memory unit having a write control line, further comprising means for generating write pulses having variable rate and variable duty cycle connected to said write control line, said write pulses generating means having a control input means for adjusting said rate and said duty cycle of said write pulses, said response means is further responsive to said output data for outputting a control signal connected to said control input of said write pulses generating means so that maximum average current flows through said memory unit.

10. A system as recited in claim 7 wherein said memory unit having a plurality of address lines, further comprising means for generating variable address signals which are applied to said address lines of said memory unit so that different memory rows are being charged in accordance with the different addresses applied to said memory unit.

11. A system as recited in claim 10, wherein said variable address signals generating means having control input for determining the generated addresses, said response means is further responsive to said output data for outputting a control signal connected to said control input of said variable address signals generating means so that maximum average current flows through said memory unit.

12. A system as recited in claim 7, further comprising means for measuring the temperature of said memory unit and outputting temperature data corresponding to the temperature of said memory unit, said response means is further responsive to said temperature data to adjust said means for generating pulses so that said memory unit can be kept at a predetermined temperature.

13. A system as recited in claim 7, wherein said power supply further comprises a voltage control input means whereby the output voltage of said power supply is variable in a range between a minimum operational voltage and a maximum operational voltage of said memory unit, said responsive means further comprises an input means for selecting a desired level of power dissipation inside said memory unit, said responsive means is further outputting a voltage control signal connected to said voltage control input means to provide a voltage level corresponding to the desired level of power dissipation inside said memory unit.

14. A system as recited in claim 7, further comprising a timing means for providing elapsed time signals to said response means, said response means is further responsive to said elapsed time signals to change the average current flowing through said memory unit so that the temperature of said memory unit is kept at different levels during periods of time corresponding to said elapsed time signals.

15. An improved memory tester for a memory unit having a row address strobe control line, of the type in which said tester having a row address strobe output connected to said row address strobe control line for outputting pulses at a rate below the maximum rate in which said memory unit is still expected to store, retain and retrieve test data, wherein the improvement comprises:

means for generating pulses with variable rate and variable duty cycle selectively set at a rate above said maximum rate; and means for switching said row address strobe control line of said memory unit from said row address strobe output of said memory tester to said pulse generating means so that the memory unit is heated by an increased rate of current spikes inside said memory unit.

16. A memory tester as recited in claim 15 wherein said memory unit having a column address strobe control line, and wherein said memory tester further comprising a second means for generating pulses with variable rate and variable duty cycle, and a second switching means for switching the column address strobe control line of said memory unit from said memory tester to said second pulse generating means when said row address strobe control line is switched to the first pulse generating means.

17. A memory tester system as recited in claim 16 wherein said memory unit having a write control line, and wherein said memory tester further comprising a third means for generating pulses with variable rate and variable duty cycle, and a third switching means for switching said write control line of said memory unit from said memory tester to said third pulse generating means when said row address strobe control line is switched to the first pulse generating means.

18. A memory tester system as recited in claim 15 wherein said memory unit having a column address strobe control line, a write control line, a plurality of address lines, and at least one data line, and wherein said memory tester continues to activate said column address strobe control line, the write control lines, the address and data lines of said memory unit in accordance with regular memory function when said means for switching is connecting the said means for generating pulses to the row address strobe control line.

19. A memory tester system as recited in claim 15 wherein said memory tester comprises a processing means for testing said memory unit at various test steps, said processing means having means for outputting a heating control signal for a separate heating step, said switching means is further controlled by said heating control signal so that a heating process can start and terminate in accordance with said heating step.

* * * * *